United States Patent [19]

Lionnet

[11] Patent Number: 4,639,060
[45] Date of Patent: Jan. 27, 1987

[54] HEAT RECOVERABLE CONNECTOR

[75] Inventor: Richard Lionnet, Parmain, France

[73] Assignee: Raychem Corporation, Menlo Park, Calif.

[21] Appl. No.: 605,513

[22] Filed: Apr. 30, 1984

[30] Foreign Application Priority Data

May 20, 1983 [GB] United Kingdom ............... 8314008

[51] Int. Cl.⁴ .............................................. H01R 4/24
[52] U.S. Cl. ........................................ 339/30; 29/866; 339/75 R; 339/97 R; 339/260
[58] Field of Search ............... 339/95 R, 95 D, 97 R, 339/97 P, 30, 26 D, DIG. 1, 74, 75 R; 29/865, 866

[56] References Cited

U.S. PATENT DOCUMENTS

| 1,208,217 | 12/1916 | Schade, Jr. ........................ 339/260 |
| 1,273,250 | 7/1918 | Luxmore ........................... 339/260 |
| 2,315,823 | 4/1943 | Smith ............................... 339/260 |
| 3,525,799 | 8/1970 | Ellis ............................. 339/DIG. 1 |
| 4,439,001 | 3/1984 | Curley et al. ..................... 339/97 R |
| 4,510,827 | 4/1985 | Flot et al. ......................... 81/9.4 |

FOREIGN PATENT DOCUMENTS

| 1213508 | 3/1966 | Fed. Rep. of Germany ...... 339/260 |
| 1269698 | 6/1968 | Fed. Rep. of Germany ...... 339/260 |
| 671532 | 10/1964 | Italy ................................... 339/260 |
| 2090076 | 6/1982 | United Kingdom . |
| 752568 | 8/1980 | U.S.S.R. ............................ 339/260 |

Primary Examiner—John McQuade
Attorney, Agent, or Firm—Ira David Blecker

[57] ABSTRACT

Connection is made to an insulated conductor (26) by the connector (2) of the invention without the need to pre-strip the conductor. The connector (2) comprises two contact members (12,14) that overlap to provide an aperture (21) for receipt of the insulated conductor (26). The connector (2) is recoverable, preferably by means of a memory metal strip (6), to cause the contact members (12,14) to slide relative to each other to reduce the aperture size, pierce the conductor insulation, and exert a permanent gripping force on the conductor.

19 Claims, 8 Drawing Figures

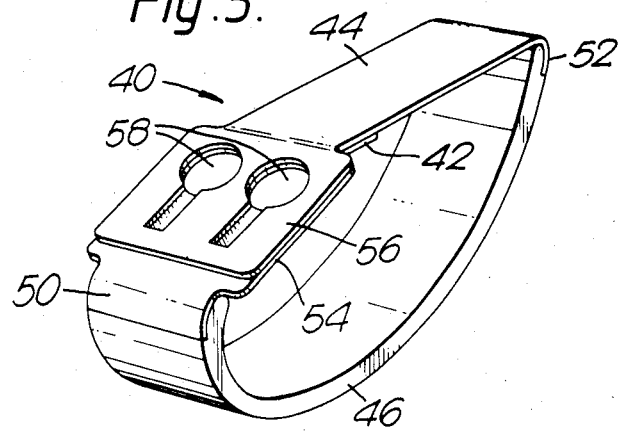
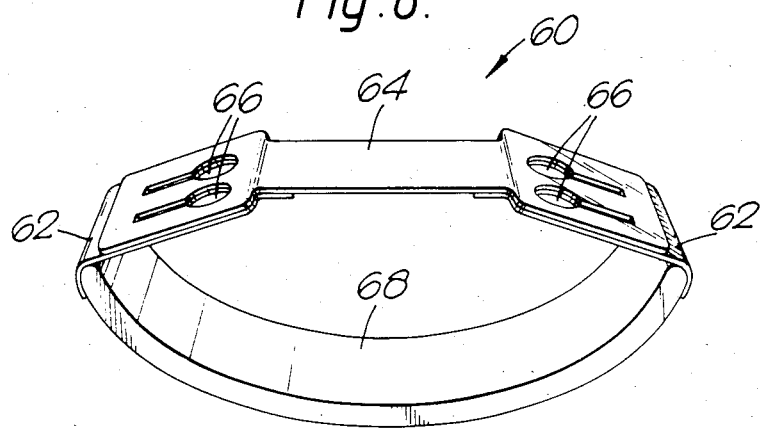

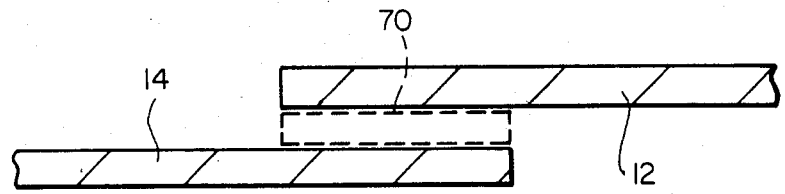
FIG_7
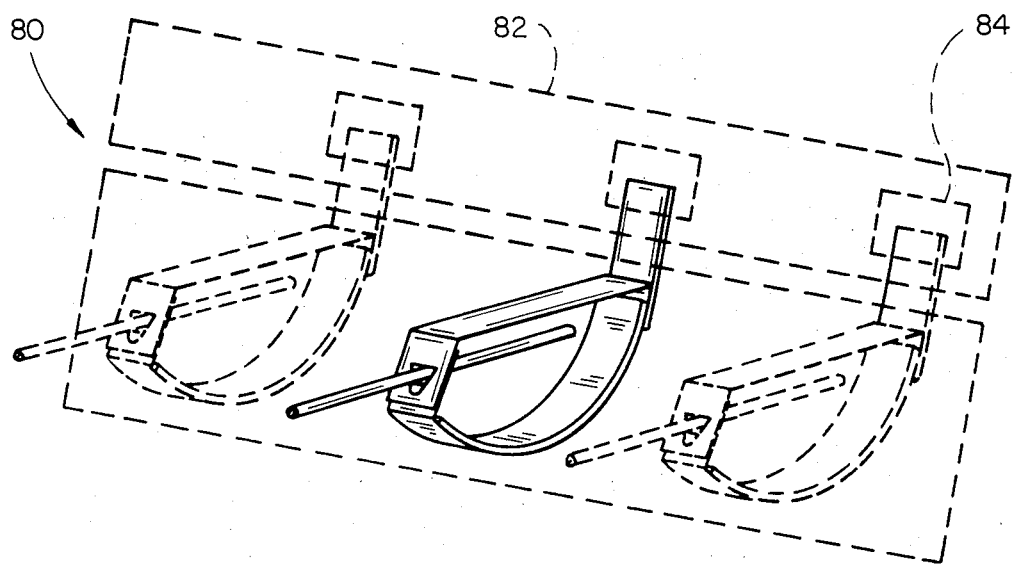
FIG_8

HEAT RECOVERABLE CONNECTOR

This invention relates to a connector for making an electrical connection to the conductor of an elongate insulated electrical conductor.

The present invention provides a connector for making an electrical connection to the conductor of an elongate insulated electrical conductor, comprising contact members that are electrically conductive at least in part and which co-operate to form an aperture for receiving the conductor, the connector being recoverable to effect relative slidable movement of the members so that the aperture is reduced in size in such a way that at least one of the members defining the reduced size aperture pierces the conductor insulation and the members exert a permanent gripping force on the conductor.

By a "permanent gripping force" is meant a gripping force that remains after the connector has been installed and in subsequent use thereof. This is advantageous since it minimises the possibility of the formed connection being damaged as a result of mechanical abuse.

In a preferred embodiment the connector is arranged such that, at normal operating conditions of the installed connector, there is a residual recovery force tending to reduce the size of the aperture and thus permanently press the walls defining the aperture against the conductor. The residual recovery force must be selected to be sufficiently large to provide the permanent gripping force, but not so large as to damage the conductor. The absolute value of the force will depend in each instance on the nature of the conductor. In one embodiment the connector comprises a stop means substantially to prevent damage of the conductor. Preferably the stop means provides a force against the recovery force of the connector sufficiently large to prevent damage of the conductor but not to prevent the permanent gripping force. The stop means may for example comprise a resiliently deformable member.

As stated above the connector of the present invention is recoverable. A "recoverable" article is one whose dimensional configuration may be made to change when subjected to an appropriate treatment. Usually these articles recover towards an original shape from which they have been previously been deformed but the term "recoverable", as used herein, also includes an article which adopts a new configuration, even if it has not been previously deformed. The article is preferably recoverable, such that its dimensional configuration may be made to change when subjected to heat treatment.

Heat recoverable articles are well known. A typical article comprises a heat recoverable sleeve, that is typically made from a polymeric material exhibiting the property of elastic or plastic memory.

Recoverable articles may also be formed from a "memory metal". In one embodiment of the present invention at least one of the contact members comprises a memory metal. In another embodiment a further member is provided to produce the relative movement of the contact members. This further member may comprise a memory metal. Both the further member and at least one contact members may comprise a memory metal.

"Memory metals" sometimes also called "Memory Alloys" are metallic materials which exhibit changes in strength and configurational characteristics on passing through a transition temperature, in most cases the transition temperature between the martensitic and austenitic states, and can be used to make heat-recoverable articles by deforming an article made from them whilst the metal is in its martensitic, low temperature state. The article will retain its deformed configuration until it is warmed above the transition temperature to the austenitic state when it will return or attempt to return towards its original configuration. It will be understood that the heat-recoverable article is capable of returning towards its original configuration without the further application of outside force. The deformation used to place the material in the heat-unstable configuration is commonly referred to as thermally recoverable plastic deformation and can also, in certain cases, be imparted by introducing strains into the article above the transition temperature, whereupon the article assumes the deformed configuration on cooling through the transition temperature. It should be understood that the transition temperature may be a temperature range and that, as hysteresis usually occurs, the precise temperature at which transition occurs may depend on whether the temperature is rising or falling. Furthermore, the transition temperature is a function of other parameters, including the stress applied to the material, the temperatures rising with increasing stress.

Amongst such memory metals there may especially be mentioned various alloys of titanium and nickel which are described, for example in U.S. Pat. Nos. 3,174,851, 3,351,463, 3,753,700, 3,759,552, British Patent Nos. 1327441 and 1327442 and NASA Publication SP 110, "55-Nitinol-The Alloy with a Memory, etc." (U.S. Government Printing Office, Washington, D.C. 1972). The property of heat-recoverablility has not however, been solely confined to such titanium-nickel alloys. Thus, for example, various beta-brass alloys have been demonstrated to exhibit this property in, e.g. N. Nakanishi et al *Scripta Metallurgica* 5 433–440 (Pergamon Press 1971), U.S. Pat. Nos. 3,783,037, 4,019,925, 4,144,104, 4,146,392 and 4,166,739, and such materials may be doped to lower their transition temperature to cryogenic regimes by known techniques. Similarly, 304 stainless steels have been shown to enjoy such characteristics E. Enami et al, id, at pp. 663–68.

For the present invention the permanent gripping force of the connector is preferably provided by a selective memory metal having a transition temperature (or temperature range) below the normal operating temperature of the connector in service. In addition the connector is preferably arranged such that on installation the aperture closes into contact with the conductor before full recovery of the memory metal. This means that after installation the partially recovered memory metal is in its high temperature state and is thus permanently attempting to recover fully and thus to return towards its original configuration. Thus the permanent gripping force is provided by a permanent recovery force. For some applications, for example where the normal temperature is in the range 15° C. to 30° C., a memory metal having a transition temperature lower than −5° C., preferably lower than −10° C., especially preferably lower than −15° C. is selected. For other applications, for example where the normal operating temperature range may commonly be as low as −40° C., a memory metal having a transition temperature lower than −50° C., preferably lower than −55° C., especially preferably lower than −60° C. is selected. Thus in service the memory metal is above its transition temperature and exerting a recovery force that is to say it is providing a permanent gripping force on the conductor.

However, the normal operating temperature of the connector in service is generally similar to that of the storage temperature of the connector before installation. Thus if a memory metal having a transition temperature below the service temperature of the connector is used the transition temperature will also be below the storage temperature and thus the memory metal will be in its high temperature state during storage and hence attempting to recover during storage. In such cases means are preferably provided so as temporarily to prevent recovery and relative movement of the contact members during storage.

Means for temporarily preventing recovery may be achieved by providing a restraining element or detent arranged to prevent relative movement of the members in a first but not in a second state. The restraining element or detent is preferably arranged such that at a first temperature it provides a force greater than the recovery force and thus prevents relative movement of the contact members, and at a second, preferably higher, temperature provides a force less than the recovery force and hence allows relative movement. The memory metal is selected such that the second temperature is higher than the storage temperature so that the recovery force does not overcome the restraining force during storage, the connector can be installed simply by heating it to the second temperature thus overcoming the restraining force of the restraining member to allow relative movement of the contact members. For use at ambient temperature, for example, the memory metal may be selected such that heat to reach the second temperature can be provided by a hot air gun or an infra-red heater.

The restraining element, whether employed with a memory metal or a resilient member e.g. a leaf spring or other spring, may be provided, for example, by a meltable material. When used with a memory metal the material preferably melts at a temperature between the first and second temperature. Hence as the temperature is raised and the viscosity of the material decreases the recovery force becomes greater than the restraining force and provides relative movement of the contact members.

In a preferred embodiment a memory metal is selected that above its transition temperature shows an increase in the force of recovery as the temperature increases. Thus a restraining member may be provided that exerts a constant mechanical force which force is higher than the recovery force at the first temperature (and hence prevents relative movement of the contact members) and lower than the recovery force at the second temperature (and thus allows relative movement of the contact members).

In general memory metals have a transition temperature within the range of from −196° C. to +135°, especially from −196° C. to −70° C. (this being the lowest temperature they are liable to encounter during everyday use), and thus may be brought into their martensitic state by immersion into liquid nitrogen. However, more recently, it has been found possible to "precondition" memory metals so as transiently to raise their transition temperature. This enables the articles made from such alloys to be kept at room temperature prior to use, when they can be recovered by heating. Such preconditioning methods, which eliminate the need for liquid nitrogen during storage and transportation, are described, for example in U.S. Pat. Nos. 4,036,669, 4,067,752 and 4,095,999. A further method of treating such alloys in order to raise their effective transition temperature is described and claimed in U.S. Pat. No. 4,149,911.

As indicated above by application of a preconditioning process to a memory metal its transition temperature can be elevated. However, once recovery has been brought about by heating the article through its new transition temperature the memory metal's response to temperature change reverts to that it possessed prior to preconditioning. Accordingly it remains austenitic until cooled to the temperature at which transition to martensite normally occurs, typically chosen to be at 0° C. or below depending upon the temperature environment likely to be encountered.

Thus in the present invention, for cases where the service and storage temperatures of the connector are similar, the problem of preventing relative movement of the contact members during storage may be solved by providing a memory metal having a normal transition temperature below the service and storage temperature of the connector but being preconditioned so as temporarily to raise the transition temperature, preferably so as temporarily to raise the transition temperature above the connector storage temperature such that during storage the memory metal is in its low temperature state. In order to install the connector the memory metal is simply heated to the new transition temperature. This causes the characteristics of the memory metal to revert to those before preconditioning. This means that the transition temperature returns to its normal temperature, i.e. below the service temperature of the connector. Hence the memory metal is in its high temperature state during service of the connector and the permanent gripping force of the connector is thereby achieved since the memory metal in its high temperature state exerts a permanent recovery force. For certain applications the memory metal is preferably preconditioned so as temporarily to raise the transition temperature above 35° C., preferably above 40° C., especially preferably above 45° C.

Arrangements that are recoverable by heat are preferred for the present invention, but is is envisaged that other means of recovery, for example light or other radiant energy, or application of a fluid, may also be employed. Where references have been made above to first and second temperatures it is intended that these should refer to parameters other than temperature where means of recovery other than heat is used.

In the present invention, the "aperture" will generally be completely closed, in use, around the conductor. The term also extends to arrangements in which the conductor is not completely enclosed.

Preferably each of the contact members has a cut-out portion, the aperture of the connector being formed by an overlap of the cut-out portions. Each cut out portion may or may not be open ended. Preferably each cut out portion comprises an aperture, the apertures initially being substantially in register so as to form a single aperture for insertion of the conductor. Advantageously, each cut-out portion comprises a first part of such size as to receive, the insulated conductor and a second, smaller part, in communication with said first part, arranged, on recovery of connector, to grip the conductor. In one preferred embodiment the first part of each cut out portion comprises a portion that tapers from a base and the second part of each cut out portion comprises a substantially semi-circular portion. Such an embodiment is particularly useful for making a connection to an insulated conductor of substantially circular cross-section.

Recovery of the connector preferably causes the contact members to slide apart accross the axis of the inserted conductor (although not necessarily in a plane that is normal to the axis of the conductor) and also urges the contact members together along the axis of the conductor. Also, the connector is preferably arranged so that recovery of the connector would, in the absence of the inserted conductor, cause the contact members to slide apart completely, the extent of sliding being limited, in use, by the presence of the conductor in the aperture.

The connector of the present invention may be used to make an electrical connection to the conductors of at least two elongate insulated electrical conductors. Thus in one embodiment the contact members cooperate to form at least two of the said apertures, each aperture being capable of receiving at least one of the conductors. Recovery of such a connector causes each of the apertures to reduce in size such that the contact members contact the inserted conductors. A connection is thus made between the contact member and each conductor. As stated above the contact members are electrically conductive at least in part. In a preferred embodiment the contact members provide an electrically conductive path between the conductors and thus the conductors are electrically connected to each other by the connector.

In one embodiment the at least two apertures are arranged to receive the insulated conductors from the same general direction so as to form a stub splice between the conductors. Especially preferably the at least two apertures are arranged side-by-side transversly of the direction of the relative movement of the contact members. In another embodiment the at least two apertures are arranged to receive the insulated conductors from a different general direction so as to form a butt splice between the conductors. Especially preferably the at least two apertures are arranged in a line substantially parallel to the direction of relative movement of the contact members.

Whilst any of a number of different configurations of recoverable member may be used, the preferred form of member is one that has been deformed to form a bow which flattens on recovery. This form of member has the advantage that the height of the connector decreases on recovery so that in use the connector has a particularly low profile.

When the arrangement is recoverable by heat, piercing of the conductor insulation is enhanced because of the softening of the insulation that consequently takes place.

The connector of the present invention operates in a particularly simple way and because of this it can advantageously be made very small. In a preferred embodiment of connector a contact pin is provided secured to the connector and in electrical contact with the contact member. Such connectors may conveniently be used to provide connections via the contact member to conductors spaced apart as little as 2.54 mm (100 mils) and even as little as 1.27 mm (50 mils).

In a preferred embodiment the connector is provided with encapsulating means arranged, in use, to protect the pierced insulated conductor. Preferably the encapsulating means electrically insulates the conductor. The encapsulating means may comprise a recoverable, preferably a heat-recoverable polymeric material. As examples of polymeric materials that may be used there may be mentioned polyethylene and polyvinylidene fluoride. Preferably the connector is arranged so that relative movement of the contact members and encapsulation are both effected by the same operation, e.g. application of heat.

In a preferred embodiment the connector comprises a contact pin, or a contact socket, secured to and in electrical contact with the contact member.

The invention also provides a connector assembly for a plurality of insulated conductors which comprises a housing having an array of contact pins or sockets, each contact pin or socket being in conductive contact with a connector according to the present invention.

The invention further provides a method of making an electrical connection to an elongate insulated electrical conductor, wherein the insulated conductor is inserted into a connector according to the invention so as to be disposed within said aperture, and wherein the connector is recovered onto the conductor so as to make electrical connection therewith.

Four embodiments of a connector and of a method of forming a connection to an insulated conductor are now described by way of example, with reference to the accompanying drawings, wherein:

FIG. 5 is a perspective view of the third embodiment of connector according to the present invention; and FIG. 6 is a perspective view of the fourth embodiment of connector according to the present invention.

FIG. 7 is an enlarged side view of the contact members of FIG. 1.

FIG. 8 is a schematical view of a connector assembly according to the present invention.

Figure 1:
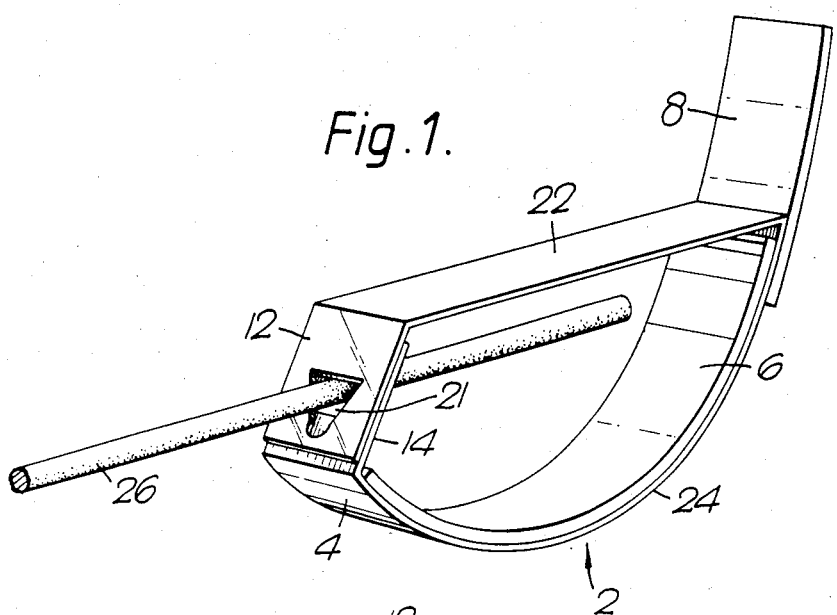
FIG. 1 is a perspective view of the first embodiment of connector according to the present invention, before recovery.
Figure 2:
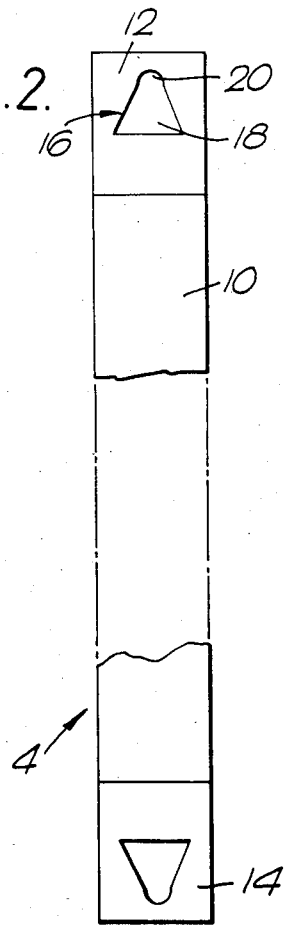
FIG. 2 is a side elevation of the memory metal strip used in the connector of FIG. 1.
Figure 3:
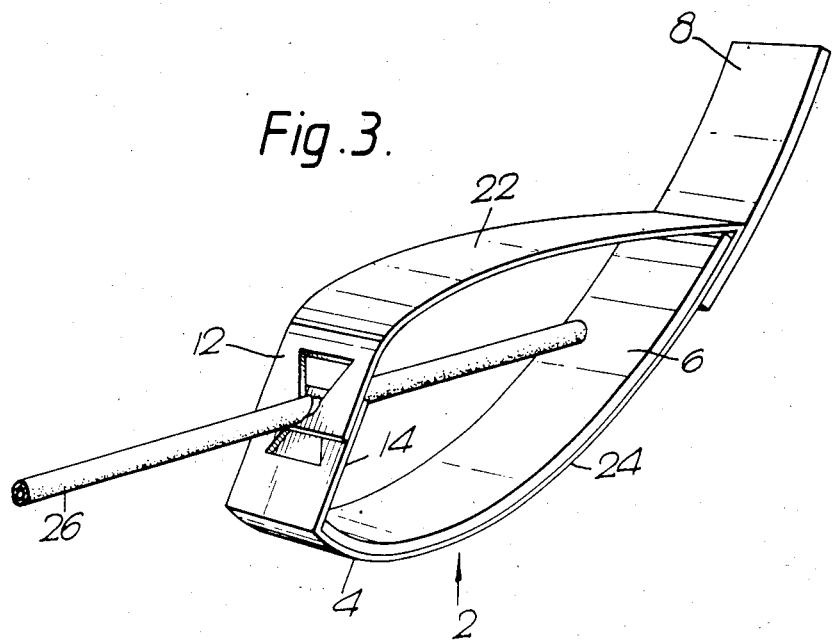
FIG. 3 is a perspective view of the connector of FIG. 1 after recovery.

Referring to FIGS. 1 to 3 a connector 2 comprises a non-recoverable brass strip 4, a beta-brass alloy 6, and a non-recoverable brass contact pin 8. The brass strip 4 comprises an elongate intermediate portion 10 and two end contact members 12, 14. Each end contact member 12,14 has a cut-out portion 16. Each cut-out portion comprises a first generally triangular shaped portion 18 and a second semi-circular portion 20 in communication with the triangular portion. At least the semi-circular portions 20 are selected to have a radius equal to that of the internal conductor of the insulated conductor 26.

The strip 4 is shown in FIG. 2 in the form in which it is stamped from a brass block. The strip is then looped on to itself so that the end portions 12,14 and the triangular portions 18 of the cut-out portions 16 therein provide an aperture 21. The strip 4 is looped to provide a connector having a straight side 22 and a bowed side 24. The end portion 14 extends from bowed side 24 and is arranged to lie inwardly of the end portion 12 that extends from the straight side 22.

The beta-brass strip 6 has been preconditioned so as temporarily to raise its transformation temperature. The strip 6 has normal and temporarily raised transformation temperatures that are respectively below and above the storage and installation temperature of the connector 2. Thus in the preconditioned state the beta-brass strip 6 is in its low temperature martensitic state before installation. In this state the strip 6 is appreciably curved.

To install the connector 2 on an insulated conductor 26 the conductor 26 is first inserted through aperture 21. Heat is then applied to raise the temperature of the beta-brass strip 6 above its temporarily raised transition temperature. This causes the strip 6 to recover and to attempt to revert to its high temperature austenitic state in which state the strip 6 has a significantly increased radius of curvature relative to the low temperature state.

Recovery of the beta-brass strip 6 causes the contact member 14 of the non-recoverable brass strip 4 to press against the contact member 12 and causes the members 12,14 to slide away from each other thereby decreasing the size of the aperture 21. As the size of the aperture 21 decreases the internal cutting edges of the aperture pierce the insulation of the insulated conductor 26 until they contact the conductor therein (FIG. 3).

Once the beta-brass strip 6 has been heated above its new transition temperature its response returns to that it possessed prior to preconditioning. Hence its transition temperature reverts to normal i.e. below the storage temperature of the connector. Hence the beta-brass strip is in its high-temperature austenstic state at the storage temperature. The connector is arranged such that the aperture contacts the conductor before the beta-brass strip has fully recovered and thus since the strip 6 is in its austenitic state it continues to exert a force on the conductor at the storage temperature. Hence where the connector is used in service at temperatures similar to the storage temperature (as is generally the case) i.e. temperatures at and above the normal transition temperature, the strip 6 will be in its austenitic state, will attempt to recover fully and will thus exert a permanent gripping on the conductor.

Figure 4:
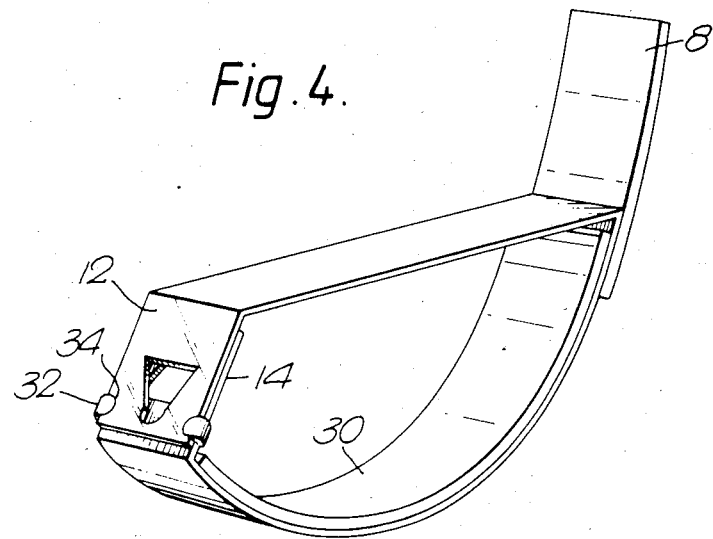
FIG. 4 is a perspective view of the second embodiment of connector according to the present invention.

FIG. 4 shows an alternative embodiment of connector. In this case the beta-brass strip 30 comprises a normal (non-preconditioned) memory metal having a transition temperature below that of storage (and hence frequently below that of service). The strip is thus in its austenitic state, attempting to recover, and hence tending to urge the contact members 12,14 to slide away from each other. A restraining member is provided in the form of a hook 32 on the contact member 14 which engages a niche 34 in the contact member 12 to restrain the sliding movement. When heat is supplied it raises the temperature further above the transition temperature which causes the recovery force of the beta-brass strip 6 to increase. At a certain temperature the recovery force is sufficiently high to overcome the restraining force of the hook and niche 32,34 and thus allows the contact members 12,14 to slide relative to each other to form the connection. Instead of the hook and niche 32,34 a meltable material 70 that restrains the sliding movement until it is melted could be used as shown in FIG. 7.

FIG. 5 shows a connector 40 for forming a stub splice between two conductors. The connector comprises two non-recoverable brass strips 42,44 and a recoverable beta-brass alloy strip 46. One end 50 of brass strip 42 is secured to one end of the beta-brass alloy 46, and one end 52 of the other brass strip 44 is secured to the other end of the beta-brass alloy 46. Brass strips 42,44 have contact members 54,56 respectively. Each contact member 54,56 contains two cut out portions 58 side-by-side. The connector is arranged such that the contact members 54,56 overlie each other such that the apertures are in registry. The beta-brass strip 46 has been preconditioned so as temporarily to raise its transiton temperature of the connector as described with reference to FIGS. 1 and 2.

To install the connector 40, two conductors are inserted, one into one aperture 58 and the other into the other aperture 58. Heat is then applied to recover the connector. The contact members move relative to each other substantially transversly of the side-by-side positioning of the apertures 58. Thus the contact members contact the inserted conductors and thereby form an electrical connection between the conductors.

FIG. 6 shows a connector 60 for forming a butt splice between four conductors, two coming from one general direction and the other two from the other general direction. The connector 60 comprises two end brass strips 62, each having two cut-out portions side-by-side therein, and a central brass strip 64 having two side-by-side cut out portions at each end thereof. The brass strip 64 is arranged to overlie the end brass strips 62 so that the cut out portions are in registry to provide four apertures 66. None of brass strips 62,64 is recoverable. A recoverable beta-brass alloy strip 68 having, a temporarily raised transition temperature is secured to the end brass strips 62 and bowed between them. The alloy strip 68 is recoverable towards a flat configuration thereby reducing the size of each of the apertures 66.

To install the connector, four conductors are inserted, one into each aperture and heat is applied to recover the connector. The apertures reduced in size to contact the conductors and thus an electrical connection is made via the central brass strip 64 between the conductors.

In FIG. 8 there is shown a connector assembly 80 for a plurality of insulated conductors which comprises a housing 82 having an array of contact sockets 84, each contact socket being in conductive contact with a connector according to the present invention.

Connections formed as described above with the connectors may if desired be protected, for example electrically insulated, by an enclosure that envelops the stripping arrangement. Such an enclosure can advantageously be formed of a heat-recoverable polymeric material, so that a single heating operation can then be effective to effect electrical connection to the conductor, and to provide electrical insulation of the connection.

Although in the embodiments of connector described with reference to the Figures the contact members 12,14 are not themselves recoverable but are operated by a separate recoverable member 6, the members may themselves be formed of a recoverable material, so that a separate recoverable member may be dispensed with. An advantage of having a recoverable member actuate a non-recoverable contact member is that each component can be individually selected for best performance. Thus, recoverable metals, which are difficult to machine, can be formed into relatively simple configurations and may be of a relatively soft material such as beta-brass, whilst a hard cutting edge may be provided on the separate, easily machinable, contact member.

I claim:

1. A connector for making an electrical connection to the conductor of an elongate insulated electrical conductor comprising contact members that are electrically conductive at least in part and which co-operate to form an aperture for receiving the insulated conductor, the connector being heat recoverable to urge the members together along the axis of the conductor and to effect relative slidable movement of the members so that the aperture is reduced in size in such a way that at least one of the members defining the reduced size aperture pierces the conductor insulation and the members exert a permanent gripping force on the conductor.

2. A connector according to claim 1, comprising a further member that is arranged to produce the relative movement of the contact members.

3. A connector according to claim 1, wherein at least one of the contact members is formed at least in part from a memory metal that transforms from a martensitic to an austenitic state.

4. A connector according to claim 2, wherein the further member is formed at least in part from a memory metal that transforms from a martensitic to an austenitic state.

5. A connector according to claim 3, wherein the memory metal has a transition temperature below the service temperature of the connector.

6. A connector according to claim 4, wherein the memory metal has a transition temperature below the service temperature of the connector.

7. A connector according to claim 2, wherein the memory metal has been pre-conditioned so as temporarily to raise the transition temperature above the storage temperature of the connector.

8. A connector according to claim 3, wherein the memory metal has been pre-conditioned so as temporarily to raise the transition temperature above the storage temperature of the connector.

9. A connector according to claim 1 comprising a restraining element arranged to prevent the relative movement of the members at a first temperature but not at a second temperature.

10. A connector according to claim 9, wherein the second temperature is higher than the first temperature.

11. A connector according to claim 10, wherein the restraining element comprises a material that melts at a temperature between the first and second temperature.

12. A connector according to claim 9, wherein the restraining element exerts a mechanical force that is greater than the recovery force at the first temperature and less than that at the second temperature.

13. A connector according to claim 1, wherein each of said members has a cut-out portion, said aperture being formed by an overlap thereof.

14. A connector according to claim 13, wherein each cut out portion comprises an aperture, the apertures initially being substantially in register so as to form a single aperture for insertion of the conductor.

15. A connector according to claim 13, wherein each of said cut-out portions comprises a first part of such size as to receive, in operation, the insulated conductor and a second, smaller part, in communication with said first part, arranged, on said recovery of the connector, to grip the conductor.

16. A connector according to claim 1 comprising a contact pin secured to and in electrical contact with the contact members.

17. A connector according to claim 1, for making an electrical connection to the conductors of at least two elongate insulated electrical conductors, wherein the contact members of the connector cooperate to form at least two of the said apertures, each aperture being capable of receiving at least one of the conductors.

18. A connector assembly for a plurality of insulated conductors which comprises a housing having a array of contact sockets, each contact socket being in conductive contact with a connector for making an electrical connection to the conductor of an elongate insulated electrical conductor comprising contact members that are electrically conductive at least in part and which co-operate to form an aperture for receiving the insulated conductor, the connector being heat recoverable to urge the members together along the axis of the conductor and to effect relative slidable movment of the members so that the aperture is reduced in size in such a way that at least one of the members defining the reduced size aperture pierces the conductor insulation and the members exert a permanent gripping force on the conductor.

19. A method of making an electrical connection to an elongate insulated electrical conductor, comprising inserting the insulated conductor into a connector for making an electrical connection to the conductor of an elongate insulated electrical conductor comprising contact members that are electrically conductive at least in part and which co-operate to form an aperture for receiving the insulated conductor, the connector being heat recoverable to urge the members together along the axis of the conductor and to effect relative slidable movement of the members so that the aperture is reduced in size in such a way that at least one of the members defining the reduced size aperture pierces the conductor insulation and the members exert a permanent gripping force on the conductor, so as to be disposed within said aperture, and recovering the connector onto the conductor so as to make electrical connection therewith and to exert a permanent gripping force on the conductor.

* * * * *

UNITED STATES PATENT AND TRADEMARK OFFICE
CERTIFICATE OF CORRECTION

PATENT NO. : 4,639,060
DATED : January 27, 1987
INVENTOR(S) : Richard Lionnet

It is certified that error appears in the above-indentified patent and that said Letters Patent is hereby corrected as shown below:

Col. 9, claim 7, line 1, replace "claim 2" should read --claim 4--.

Signed and Sealed this

Third Day of August, 1993

Attest:

MICHAEL K. KIRK

Attesting Officer

Acting Commissioner of Patents and Trademarks